(12) United States Patent
Czarnecki (10) Patent No.: US 9,276,346 B1
(45) Date of Patent: Mar. 1, 2016

(54) GASKETLESS FLIP LID FOR A FLANGED POWER INLET RECEPTACLE

(71) Applicant: Reliance Controls Corporation, Racine, WI (US)

(72) Inventor: Neil A. Czarnecki, Mt. Pleasant, WI (US)

(73) Assignee: Reliance Controls Corporation, Racine, WI (US)

( * ) Notice: Subject to any disclaimer, the term of this patent is extended or adjusted under 35 U.S.C. 154(b) by 255 days.

(21) Appl. No.: 13/834,404

(22) Filed: Mar. 15, 2013

(51) Int. Cl.
  *H01R 13/447* (2006.01)
  *H05K 13/00* (2006.01)

(52) U.S. Cl.
  CPC .............. *H01R 13/447* (2013.01); *H05K 13/00* (2013.01)

(58) Field of Classification Search
  CPC ......... H02G 3/14; H02G 3/088; H02G 3/126; H01R 13/447; H05K 13/00
  USPC .......... 174/66, 67, 53, 480; 439/536; 220/3.2, 220/3.3, 3.8, 241, 242
  See application file for complete search history.

(56) References Cited

U.S. PATENT DOCUMENTS

| | | |
|---|---|---|
| 1,131,667 A | 3/1915 | Bommer |
| 2,856,470 A | 10/1958 | Hyde |
| 3,277,251 A | 10/1966 | Daly |
| 3,284,591 A | 11/1966 | Daly |
| 3,315,556 A | 4/1967 | Speck |
| 3,361,938 A | 1/1968 | Watson |
| 3,391,374 A | 7/1968 | Schleicher |
| 3,523,166 A | 8/1970 | Daly |
| 3,559,148 A | 1/1971 | Hafer |
| 3,636,237 A | 1/1972 | Hafer |
| 3,654,484 A | 4/1972 | Jorgenson et al. |
| 3,716,683 A | 2/1973 | Hafer |
| 3,723,942 A | 3/1973 | Dennison |
| 3,731,256 A | 5/1973 | Hafer |
| 3,739,321 A | 6/1973 | Murphy et al. |
| 3,742,431 A | 6/1973 | Kobyner |
| 3,781,765 A | 12/1973 | Schleicher |
| 3,922,053 A | 11/1975 | Hafer |
| 4,058,358 A | 11/1977 | Carlisle |
| 4,067,529 A | 1/1978 | Milcoy |
| 4,088,829 A | 5/1978 | Milcoy |
| 4,282,954 A | 8/1981 | Hill |
| 4,605,817 A | 8/1986 | Lopez |
| 4,669,281 A | 6/1987 | Young |
| 4,979,634 A * | 12/1990 | Begley ............... H01H 9/287 16/267 |
| 5,070,252 A | 12/1991 | Castenschiold et al. |
| 5,174,773 A | 12/1992 | Jones |
| 5,265,511 A | 11/1993 | Itzov |
| 5,268,850 A | 12/1993 | Skoglund |
| 5,310,075 A | 5/1994 | Wyler |

(Continued)

*Primary Examiner* — Jenny L Wagner
*Assistant Examiner* — Pete Lee
(74) *Attorney, Agent, or Firm* — Boyle Fredrickson, S.C.

(57) ABSTRACT

A power inlet box suitable for outdoor or external use is configured in such a manner so as to prevent moisture from entering the power inlet enclosure. A hinged lid assembly is installable directly on the top face of a flanged power inlet enclosure to provide a face seal therewith. The hinged lid assembly has a cover and a base that form a tongue-and-groove seal, thus providing a first line of defense from moisture or other contaminants entering the inlet. As a second line of defense, a tapered stopper is provided on the inside of the cover to provide a stopper seal. A lateral seal is provided at the hinge point of the hinged lid assembly to prevent moisture from entering the hinge area where a tongue-and-groove seal is not present.

16 Claims, 7 Drawing Sheets

(56) References Cited

U.S. PATENT DOCUMENTS

| | | | | |
|---|---|---|---|---|
| 5,402,323 | A | 3/1995 | Schwenk et al. | |
| 5,573,412 | A * | 11/1996 | Anthony | H01R 13/6397 220/242 |
| 5,579,201 | A | 11/1996 | Karageozian | |
| 5,590,440 | A | 1/1997 | Pelt et al. | |
| 5,717,164 | A | 2/1998 | Shetterly | |
| 5,773,757 | A | 6/1998 | Kenney et al. | |
| 5,980,278 | A | 11/1999 | Winkler | |
| 5,984,719 | A | 11/1999 | Flegel | |
| 6,148,480 | A | 11/2000 | Cooke | |
| 6,276,027 | B1 | 8/2001 | Hanna | |
| 6,564,427 | B1 | 5/2003 | Flegel | |
| 7,105,745 | B2 | 9/2006 | Drane et al. | |
| 7,148,421 | B2 * | 12/2006 | Nagashima et al. | 174/67 |
| 7,709,735 | B2 | 5/2010 | Vigorito et al. | |
| 2006/0037773 | A1 | 2/2006 | Castaldo et al. | |
| 2006/0191701 | A1 * | 8/2006 | Herzog | 174/66 |
| 2009/0255703 | A1 | 10/2009 | Vigorito et al. | |
| 2012/0312577 | A1 * | 12/2012 | Carbone | H02G 3/088 174/66 |

\* cited by examiner

GASKETLESS FLIP LID FOR A FLANGED POWER INLET RECEPTACLE

BACKGROUND OF THE INVENTION

The present invention relates to a power inlet box, which is typically mounted to the exterior of a building and which provides an inlet for the supply of electrical power from an auxiliary power source such as a generator, and more particularly, pertains to a power inlet box equipped with an protective lid to prevent outside elements from entering the power inlet.

In an auxiliary power supply system, a remote power generator is interconnected with a power inlet box, which is typically mounted to the exterior of a building or dwelling. The power inlet box is, in turn, typically interconnected with a transfer switching arrangement, which is connected to the main electrical panel or load center of the building. A cord is interconnected with the power outlet of the generator and with a power inlet receptacle or socket associated with the power inlet box for providing power from the generator through the power inlet box to the transfer panel, and ultimately to the main electrical panel in order to supply power to certain circuits of the building in the event of a power outage or the like.

Prior art power inlet boxes generally include a base member adapted to be mounted to a wall of the building, and a cover member or assembly that is movably interconnected with the base member. The base member defines an internal cavity, and the cover member is configured to enclose the internal cavity. The power inlet includes an access cover, which is pivotable between a closed position in which the access cover prevents access to the power receptacle socket structure, and an open position providing access to the power receptacle socket structure. Other prior art power inlet boxes having a base member and a cover assembly are known wherein a power inlet is mounted to a bottom wall of the cover assembly such that the inlet is openly accessible from beneath the power inlet box.

With such conventional power inlet boxes, moisture and dirt may easily enter the power inlet box through the many air gaps and openings provided between the base member and the cover.

In order to prevent ingress of moisture, dirt and other contaminants, which may damage the electrical components, the current state-of-the art for power inlet boxes involves a generally circular spring-loaded lid that closes against a generally circular base element, into which a flanged socket-type inlet is installed. In order to protect the flanged inlet and the interior of the enclosure into which the flanged inlet is installed from the outside elements, current units have utilized gaskets to provide a weatherproof seal. Gaskets are typically made from a resilient material, e.g., neoprene rubber, which is able to deform and tightly fill any space irregularities. However, gaskets are expensive, difficult to install, and are prone to failure from loss of compliance over time due to compression set, temperature aging, tearing, adhesion to the cover, and a host of other issues.

The present invention seeks to improve upon such prior art by providing a gasketless assembly for a power inlet protection lid, while still providing the weatherproofing feature desired.

SUMMARY OF THE INVENTION

The present invention is generally directed to a power inlet box suitable for outdoor or external use and configured in such a manner so as to prevent moisture and dirt from entering the inlet box. The power inlet box may be formed from weather resistant material such as plastic, corrosion resistant aluminum, galvanized steel, etc., and may be designed such that the electrical socket faces any number of directions but in such a way that an electrical connector can be easily attached.

In one embodiment, the power inlet box includes a base or frame that may be mounted to the wall of a building. The base receives a flanged power inlet that is configured to be protected against rain, snow, dust, dirt, and the like by a removable hinged lid. The removable hinged lid contains a number of seals to prevent moisture and dirt from entering the power inlet.

In particular, a first seal may be formed between the removable hinged lid and the flanged power inlet. The flanged power inlet may be generally circular in shape, and may "face seal" with a generally circular hinged lid which is disposed directly on top of the flanged power inlet and may be secured by a number of attachment means, such as by screw-force deformation.

A second seal may be formed through the interaction of the removable hinged lid itself, and in particular, between the cover and the base of the hinged lid. The base of the hinged lid assembly may have an annular "groove-like" depression for receiving a corresponding annular "tongue" protrusion of the cover. The two components may cooperate to provide a "tongue-and-groove" seal when the cover is in a closed position t.

A third seal may be formed between the cover and the base of the hinged lid, by providing the cover with a tapered stopper that is received within a correspondingly tapered opening of the base to create a "sink stopper" seal. Thus, any moisture or dirt, which is able to pass the perimeter of the hinged lid, must also pass the "sink stopper" seal to reach the interior of the power inlet.

A fourth seal may be formed at the hinge point of the hinged lid between the cover and the base. A protrusion located at an upper edge of the hinge fits within a laterally facing slot located near a bottom edge of the hinge when the cover is in the closed position. This creates a "slot seal" at the hinge and prevents moisture from entering the hinge area where the annular "tongue-and-groove" seal is not present due to the structure of the hinge.

Therefore, it is an object of the present invention to provide a power inlet box that utilizes a removable lid having a number of defenses against moisture entering the interior of a power inlet.

It is an additional object of the present invention to provide a lid that is installable on a flanged power inlet assembly to provide a weatherproof power inlet box.

It is an additional object of the present invention to provide a weatherproof power inlet box without the use of gaskets.

Various other features, objects and advantages of the present invention will be apparent from the following detailed description taken together with the drawings.

BRIEF DESCRIPTION OF THE DRAWINGS

The drawings illustrate the best mode presently contemplated for carrying out the invention.

In the drawings.

DETAILED DESCRIPTION OF THE DRAWINGS

This invention relates to a gasketless cover for a power inlet receptacle having a number of features configured to prevent moisture and dirt from entering the power inlet receptacle.

Figure 1:
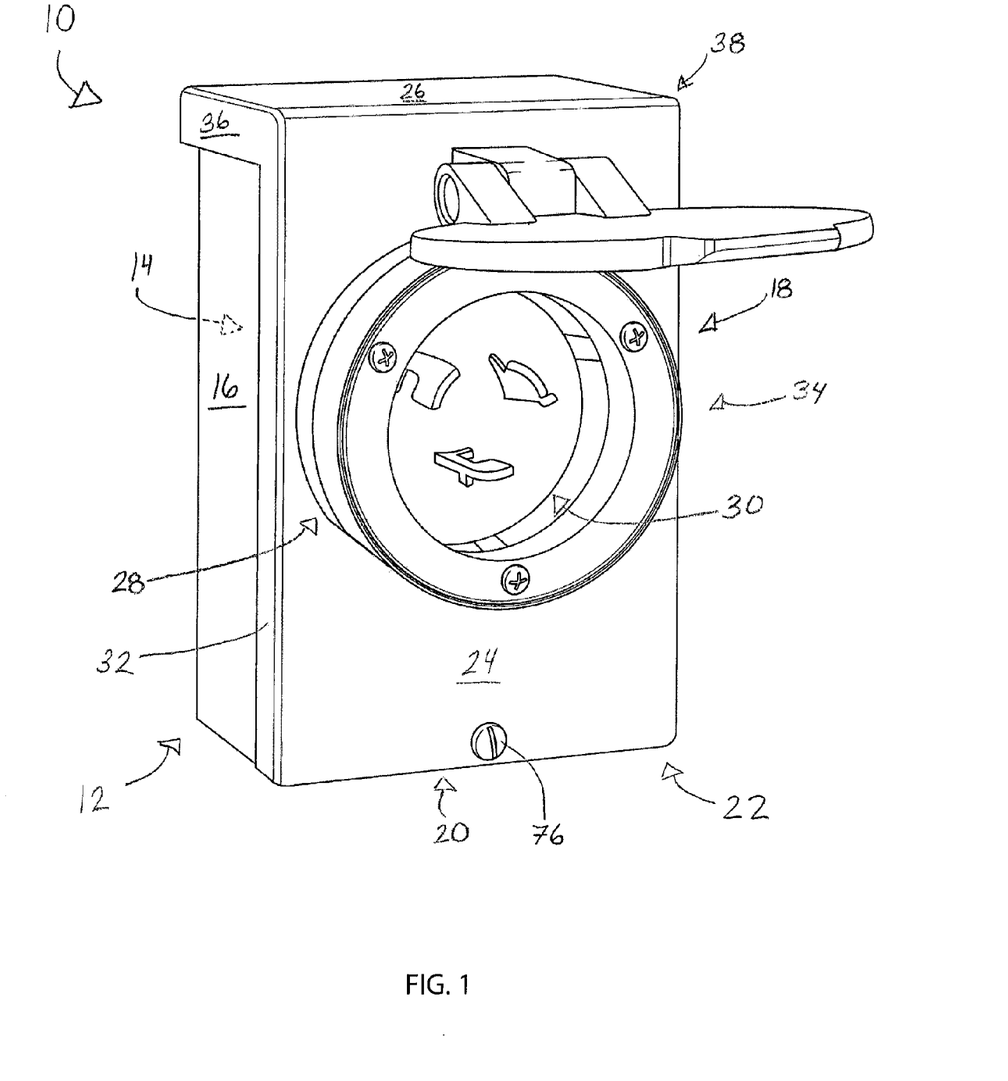
FIG. 1 is an isometric view of a power inlet box incorporating a gasketless lid assembly in accordance with the present invention, showing the lid assembly in an open position.

Referring to FIG. 1, an isometric view of a power inlet box 10 is shown. The power inlet box 10 may be mounted to the exterior of a building wall. However, it is understood that power inlet box may be mounted in any desired location on the building, e.g., on an interior wall. A conduit (not shown) extends from the interior of the building wall to the exterior of the wall, and is interconnected with the power inlet box 10 via any satisfactory, conventional wire routing structure. A flexible cord (not shown) has a plug at one end, which is engageable with the power outlet of an auxiliary power source, e.g., a generator. At its opposite end the cord includes a connector, which is engageable with power inlet box 10 for supplying power to the power inlet from the generator, in a manner as is known.

The power inlet box 10 includes a base 12 or frame that is defined by a rear wall 14, and a pair of side walls 16, 18 extending forwardly from the sides of rear wall 14. A bottom wall 20 extends forwardly from the lower end of rear wall 14, and extends between the lower ends of side walls 16, 18. A series of openings may be formed in rear wall 14 for use in mounting base 12 to a wall.

A cover assembly 22 includes a front wall 24 and a top wall 26 extending rearwardly from the upper end of front wall 24. Front wall 24 includes a central opening 28 for receiving a power inlet 30. Power inlet 30 is in the form of a power receptacle socket assembly mounted to front wall 24 and extending through opening 28.

A pair of side flanges 32, 34 extend rearwardly from the side edges of front wall 24, throughout the height of front wall. Similarly, a pair of flanges 36, 38, extend downwardly from the side edges of top wall 26 between the side flanges. An opening may be formed in the lower end of front wall 24, and a threaded fastener 76, such as a screw, may be threadedly engageable with the opening to securely couple cover assembly 22 with base 12. Bottom wall 20 may have a flange at its outer end for threadedly receiving fastener 76.

Figure 2:
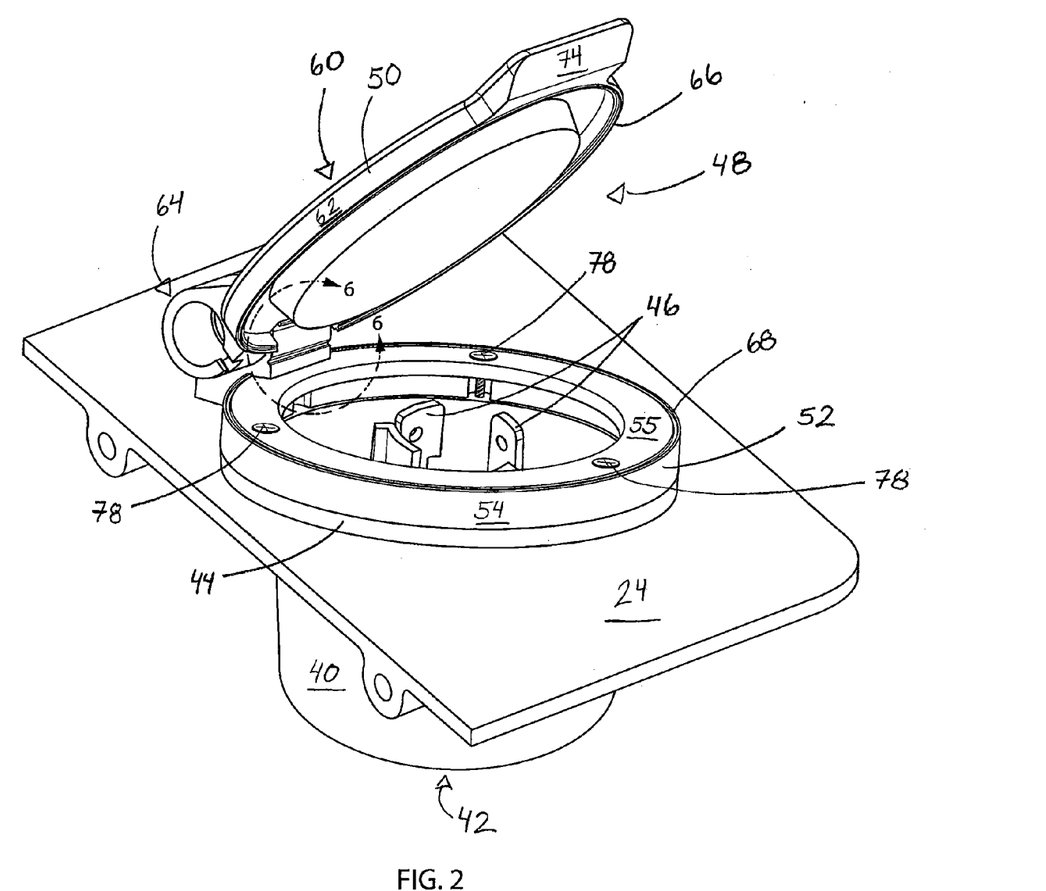
FIG. 2 is an isometric view of the front wall or base and lid assembly of the power inlet box of FIG. 1 removed from the power inlet box and showing the access cover in the open position to provide access to the power inlet.
Figure 3:
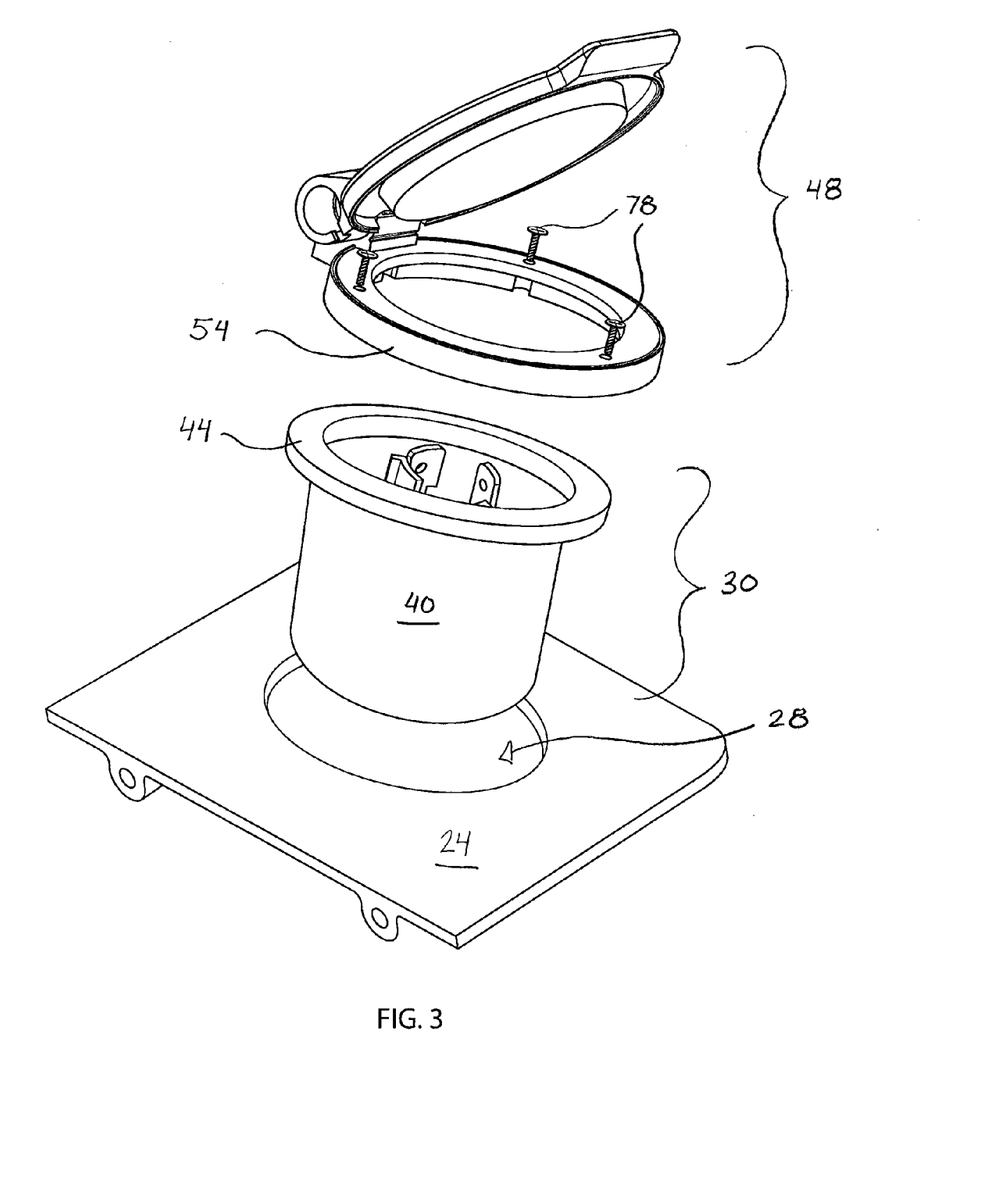
FIG. 3 is an exploded isometric view of the lid assembly of FIG. 2 showing the hinged lid, flanged power inlet, and base separately removed.

Referring to FIGS. 1-3, the power inlet 30 includes a cylindrical side wall 40 terminating in an inner end wall 42 having a central opening for electrical coupling, as is known. A flange 44 extends outwardly from the outer end of side wall 40. A receptacle block having a series of outwardly extending prongs 46 is mounted in the interior of power inlet 30. The receptacle block includes terminals adapted to receive and electrically engage a series of wires for conducting power from prongs 46.

A removable lid assembly 48 in accordance with the present invention is utilized to secure power inlet 30 to base 24. Lid assembly 48 includes a hinged cover 50 hingedly attached to a base member 52. Base member 52 has a generally circular sidewall 54 and an upper flange 55 extending inwardly from the upper sidewall 54. The upper edge of circular sidewall 54 provides a circuitous groove 68 for receiving a protruded tongue of cover 50. The upper flange 55 has a series of openings for receiving a corresponding number of threaded fasteners 78, e.g., screws, for engagement within openings in base 24 for coupling the lid assembly 48 with the upper edge of power inlet 30.

Cover 50 has a circular top wall 60 and a circumferential flange 62 extending downwardly from the outer edge of top wall 60. The flange 62 may have a protruded tongue 66 for insertion into groove 68 of the upper edge of circular sidewall 54. Cover 50 may also have a protruded lip 74 extending outwardly from top wall 60 to assist the user in opening and closing cover 50. Cover 50 is pivotable via a hinge 64 between an open position, as shown, and a closed position. Hinge 64 may include a conventional pivot pin defining a pivot axis of cover 50, and a torsion spring for biasing the cover 50 toward a closed position.

Referring to FIG. 3, the flanged power inlet 30 is slidably received into the opening 28 of front wall 24, or any other similar opening provided by a surface of a power inlet box or the like. The flange 44 of power inlet 30 rests upon the outside surface of wall 24, and more particularly, rests upon the surrounding edges of opening 28. The flange 44 rests directly on top of front wall 24 such that the flat surfaces of the flange 44 and front wall 24 are in direct contact, thus providing a face seal between the power inlet 30 and the power inlet box 10 such as to provide a waterproof seal and prevent moisture and dirt from entering the interior of inlet box 10.

The removable lid assembly 48 is coupleable to the power inlet 30 by disposing the base 54 of lid assembly 48 on the top edge of flange 44 of the power inlet 30. The base 54 may be securely engaged with flange 44 by utilizing screws 78 engageable with the front wall 24 and extending through both the base 54 and the flange 44, thus providing a screw-force generated deformation face seal between the facing surfaces of front wall 24, flange 44 and base 54. The face seal provides a waterproof seal and prevents moisture from entering the power inlet 30.

Figure 4:
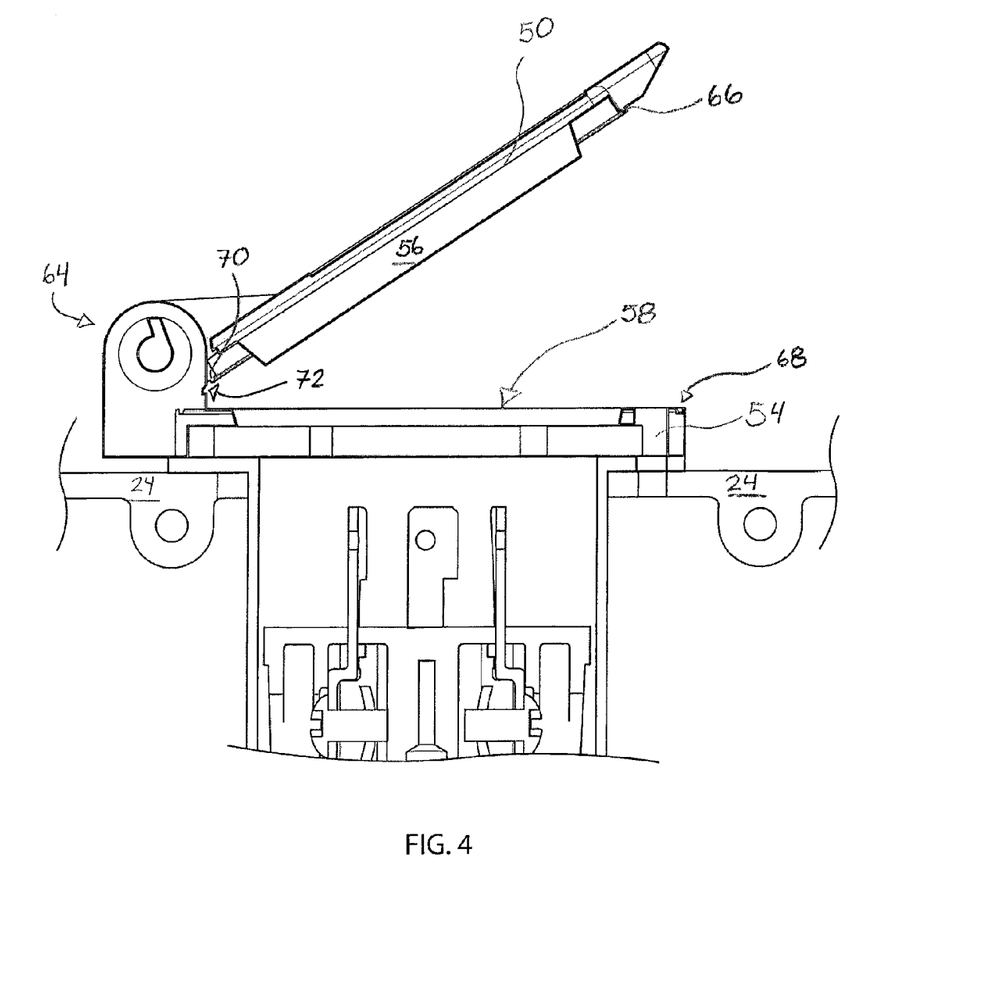
FIG. 4 is a partial section view of the inlet box base and lid assembly of FIG. 2, showing the cover of the hinged lid in an open position to provide access to the power inlet.
Figure 5:
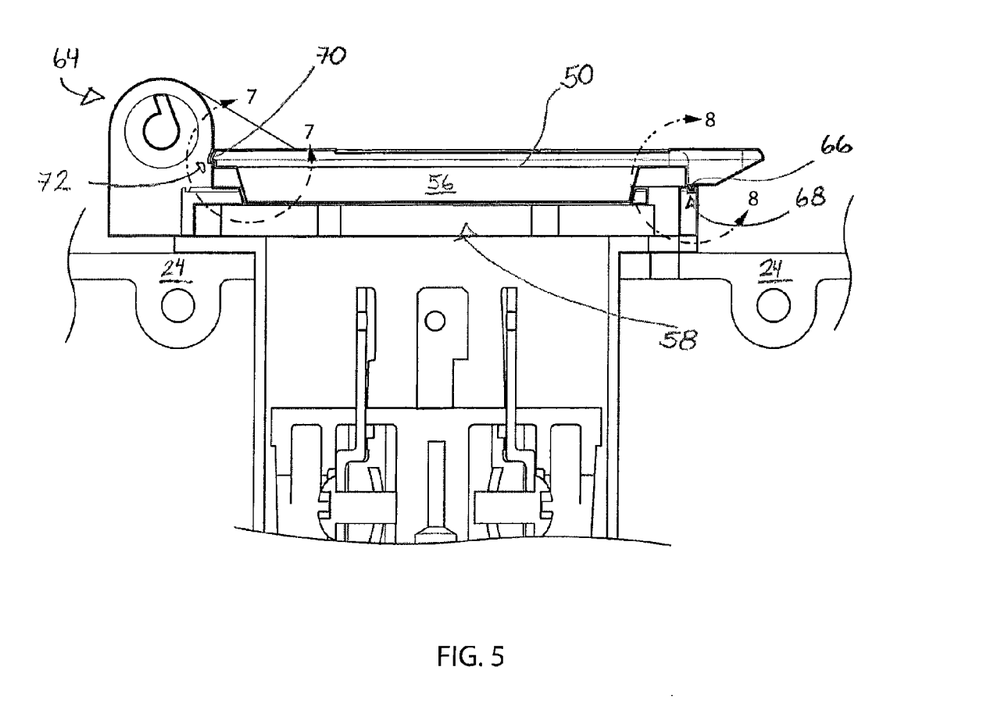
FIG. 5 is a partial section view similar to FIG. 2, showing the hinged lid in a closed position and multiple engagements of the cover with the base of the lid.

FIGS. 4 and 5 illustrate the removable lid assembly 48 installed on top of the power inlet 30 and received within the opening 28. The arrangement is shown with cover 50 in an open position in FIG. 4, allowing access to the power inlet, and with cover 50 in a closed position in FIG. 5, with the positive engagement of all the aforementioned weatherproofing seals preventing access to the power inlet. Engagement members 56, 66, 70 are located on or near cover 50, and interact with corresponding receiving members 58, 68, 72 located on or near base 54 to provide a weatherproof seal, in a manner to be explained.

As shown in FIG. 4, the perimeter of the inside surface of cover 50 contains a protruding tongue 66 for interaction with a correspondingly shaped groove 68 located at the perimeter of base 54. As seen in FIG. 5, when cover 50 is rotated to a closed position, the protruding tongue 66 is received within groove 68 to provide a tongue-and-groove seal. Any moisture attempting to penetrate the interior must travel a circuitous serpentine path whose tolerance is less than that of the minimum droplet dimension of water, to prevent entry of moisture through the tongue-and-groove seal. It is understood, of course, that the described components could be reversed, in that the inside surface of cover 50 may be provided with a groove and the perimeter of base 54 may be provided with a correspondingly shaped tongue or ridge, which functions in a similar manner.

Referring again to FIG. 4, cover 50 may have an inside surface containing a protruded tapered stopper 56. The tapered stopper 56 is a generally truncated cylindrical protrusion with inwardly tapered sides. Base 54 may have a mirror-imaged opening 58 for receiving tapered stopper 56, and sized to provide a tight seal between the cover 50 and the base 54. As seen in FIG. 5, when the cover 50 is in the closed position, the tapered stopper seal 56 is received within the mirror-imaged opening 58 to provide a stopper-type seal therewith. Thus, a second line of defense from moisture or dirt entering the power inlet 30 is provided.

Referring again to FIG. 4, a slot seal is provided near hinge assembly 64 which provides a waterproofing seal where the tongue-and-groove seal is unable to be implemented due to the presence of hinge 64. A laterally extending protrusion 70 located at the upper edge of hinge assembly 64 is movable with the rotation of cover 50 and is engageable with a corresponding laterally facing stationary slot 72, provided at the lower edge of hinge assembly 64. As seen in FIG. 5, when cover 50 is in the closed position, protrusion 70 is received within slot 72 so as to provide a slot seal and prevent moisture and dirt from entering the hinge assembly 64. Again, it is understood that the described components may be reversed, in that the protrusion may be provided on the hinge and the slot may be provided on the cover. It can thus be appreciated that the axial tongue-and-groove seal provided by tongue 66 and groove 68, together with the lateral slot seal provided by protrusion 70 and slot 72, thus provide a seal about the entire perimeter of cover 50 and base 54.

Figure 6:
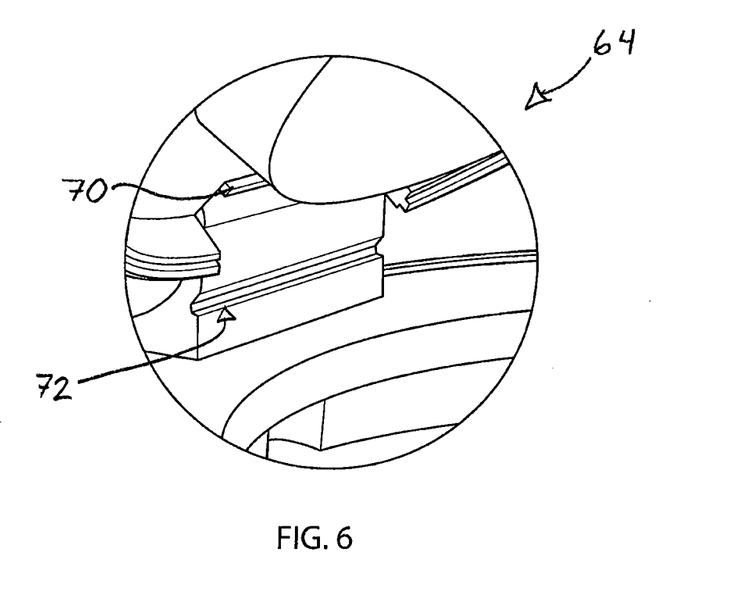
FIG. 6 is an enlarged partial isometric view of the tapered slot seal located near the hinge point when the cover is in an open position, with reference to line 6-6 of FIG. 2.
Figure 7:
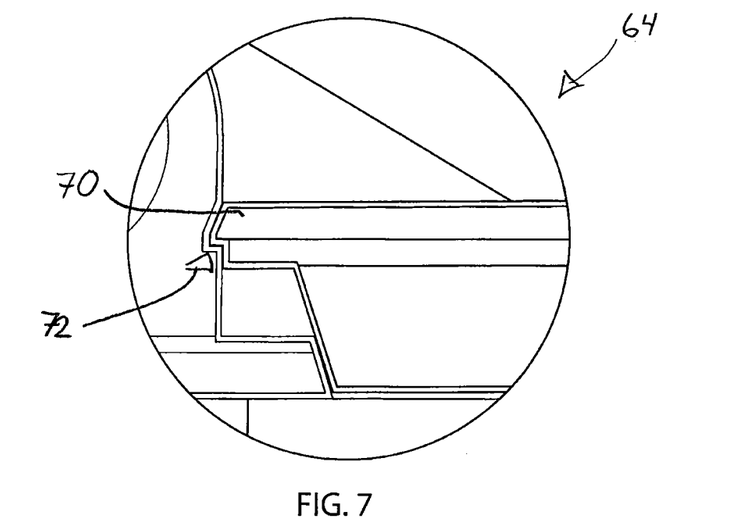
FIG. 7 is an enlarged partial section view showing the engagement of the tapered slot seal when the cover is in a closed position, with reference to line 7-7 of FIG. 5.

FIG. 6 shows cover 50 in the open position, and the slot seal elements of hinge 64 in an unengaged position. The protrusion 70 located at the upper edge of hinge assembly 64 is unengaged with corresponding slot 72 located at the lower edge of hinge assembly 64. As seen in FIG. 7, when the cover 50 is rotated to the closed position, the protrusion 70 is laterally received within slot 72 to provide a slot seal near the hinge point, and preventing moisture from entering the hinge assembly 64.

Figure 8:
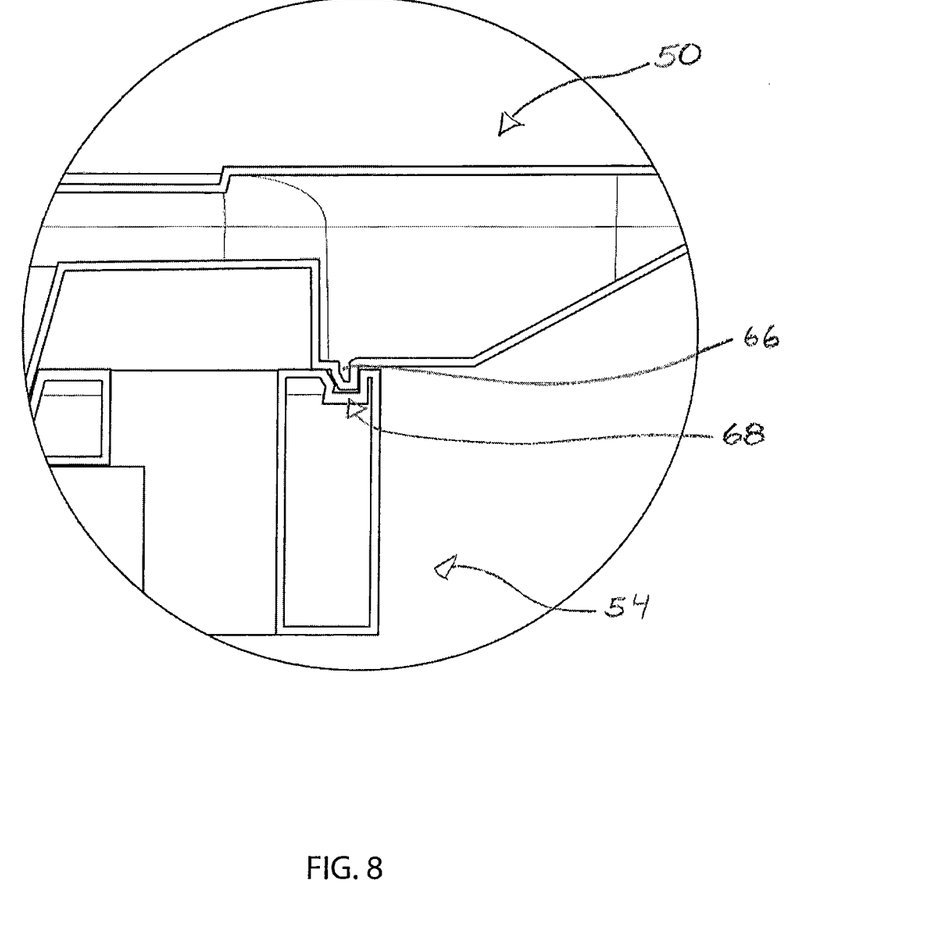
FIG. 8 is a an enlarged partial section view showing the tongue-and-groove seal between the cover and the base of the lid, with reference to line 8-8 of FIG. 5.

FIG. 8 shows the tongue-and-groove seal between the cover 50 and the base 54 when the cover is in a closed position. The protruding tongue 66 is received within the groove 68 to provide a weatherproof seal and prevent moisture from entering the inlet. The width of groove 68 is less than that of the minimum dimensions of water to prevent water droplets from entering the seal. Additionally, any moisture that is able to penetrate the seal must travel a circuitous serpentine path rather than allow moisture to enter the interior.

It can thus be appreciated that the present invention provides a sealing arrangement for a flanged power inlet that includes several lines of defense against entry of moisture or other contaminants into the interior of the power inlet, without the use of gaskets or the like. Specifically, the sealing arrangement contemplates an outer line of defense providing by the slot seal and the tongue-and-groove seal, and an inner line of defense provided by the stopper-type seal formed by the mating tapered edges. This functions to simplify the number of components and assembly of a power inlet arrangement, while at the same time, providing weatherproof features that extend throughout the life of the power inlet arrangement without the failures commonly associated with a gasket-type arrangement.

Various alternatives and embodiments are contemplated as being within the scope of the following claims, which particularly point out and distinctly claim the subject matter regarded as the invention.

I claim:

1. A power inlet protection lid assembly comprising:
 a base member having an opening and adapted for mounting to a power inlet, wherein the opening is defined at least in part, by an angled sidewall;
 a cover member; and;
 a hinge member connected between the base member and the cover member and configured to enable rotation of the cover member with respect to the base member between an open position and a closed position;
 wherein the cover member has an outer surface and an inner surface, wherein the inner surface includes a protrusion having a tapered wall shaped and dimensioned to engage the angled sidewall of the opening when the cover member is in the closed position, wherein the tapered wall of the protrusion and the angled sidewall of the opening cooperate to form an inner seal of the opening, and wherein the cover member further includes a first engagement element located outwardly from the protrusion and shaped and dimensioned to engage a second engagement element defined by the base member when the cover member is in the closed position, wherein the first and second engagement elements cooperate to form a first portion of an outer seal of the opening at a location spaced outwardly from the inner seal, wherein the first portion of the outer seal defines a pair of spaced-apart end portions between which the hinge member is located; and
 wherein the cover member includes a third engagement element that moves along with the cover member toward and away from the hinge member when the cover member is moved toward and away from the closed position, and wherein the hinge member includes a fourth engagement element that remains stationary when the cover member is moved toward and away from the closed position, and wherein the third and fourth engagement elements engage each other when the cover member is in the closed position and cooperate to form a second portion of the outer seal of the opening at a location spaced from the inner seal and extending between the spaced-apart end portions of the outer seal, and wherein the third and fourth engagement elements are spaced apart from each other when the cover member is moved to the open position.

2. The power inlet protection lid assembly of claim 1 wherein:
 the third and fourth engagement elements, respectively, comprise a second protrusion on the cover member engageable with a slot in the hinge member to form the second portion of the outer seal when the cover member is in the closed position.

3. The power inlet protection lid assembly of claim 1 wherein the base member and the power inlet are mounted in direct contact to provide a face seal.

4. The power inlet protection lid assembly of claim 3 wherein the base member and the power inlet are secured by a plurality of fasteners.

5. The power inlet protection lid assembly of claim 1 wherein the first and second engagement elements, respectively, comprise a third protrusion on the cover member shaped and dimensioned to engage a corresponding groove in the base member.

6. The power inlet protection lid assembly of claim 5 wherein the third protrusion and groove provide a tongue-and-groove seal.

7. The power inlet protection lid assembly of claim 5 wherein a tolerance of the groove is less than that of a minimum droplet of water.

8. The power inlet protection lid assembly of claim 1 wherein the power inlet has a flange which engages the side wall.

9. The power inlet protection lid assembly of claim 1 further comprising a lip on the outer surface to assist in rotating the cover member.

10. A protection lid for an electrical device comprising:
a base sized and dimensioned to correspond with a dimension of an electrical opening and forming a seal with an upper edge of the electrical opening, wherein the base includes an angled opening defined by an inner sidewall;
a cover carried by the base and sized and dimensioned to overlie the angled opening and forming a seal with the upper edge of the base;
a frustoconical protrusion disposed on an inside face of the cover, wherein the frustoconical protrusion has an angled sealing surface sized and dimensioned to correspond with the angled opening in the base and forming an inner seal with the inner sidewall of the angled opening in the base;
a hinge that hingedly connects the base and the cover so as to enable the cover to be rotatably moved between an open position and a closed position, wherein the hinge has a slot that extends across a width defined by the hinge, and wherein the cover includes a protrusion that moves along with the cover toward and away from the hinge when the cover is moved toward and away from the closed position, wherein the slot of the hinge remains stationary when the cover is moved toward and away from the closed position, and wherein the protrusion of the cover is spaced apart from the slot of the hinge when the cover is in the open position and is engaged within the slot of the hinge when the cover is in the closed position, and wherein engagement of the protrusion within the slot forms a portion of an outer seal between the cover and the base that is located outwardly of the inner seal.

11. The protection lid of claim 10 wherein the base has a groove defining a pair of ends, each of which is located adjacent the hinge, and wherein the cover has a protrusion that is configured to be received within the groove when the cover is in the closed position to form a tongue-and-groove seal between the cover and the base other than at the location of the hinge, wherein engagement of the protrusion of the cover within the slot of the hinge forms a first portion of the outer seal between the cover and the base and the tongue-and-groove seal forms a second portion of the outer seal between the cover and the base.

12. The protection lid of claim 10 wherein the base and the electrical opening are disposed to form a face seal with one another.

13. A method of forming a weatherproof seal between a power inlet and a cover, comprising:
positioning a lid assembly onto a flanged power inlet, wherein the lid assembly includes a base member having an opening and a side wall, a cover member having an outer surface and an inner surface wherein the inner surface contains a frustoconical protrusion having an angled sealing surface that is shaped and dimensioned to engage a peripheral angled surface defined by the opening to form an inner seal of the opening, and a hinge member that hingedly connects the base member and the cover member to enable the cover member to be hingedly rotated with respect to the base member between an open position and a closed position, wherein the hinge member has a slot that extends across a width defined by the hinge member, and wherein the cover member includes a protrusion that moves along with the cover member toward and away from the hinge member when the cover member is moved toward and away from the closed position, wherein the slot of the hinge member remains stationary when the cover member is moved toward and away from the closed position, and wherein the protrusion of the cover member is spaced apart from the slot of the hinge member when the cover member is in the open position and is engaged within the slot of the hinge member when the cover member is in the closed position, and wherein engagement of the protrusion within the slot forms a portion of an outer seal between the cover member and the base that is located outwardly of the inner seal, and wherein the lid assembly further includes at least one hole extending through the side wall; and
inserting a fastener through the hole, and tightening the fastener to axially compress the lid assembly onto the flanged power inlet.

14. The method of claim 13 wherein the inner surface of the cover member has a protrusion shaped and dimensioned to engage a corresponding groove of an upper edge of the side wall to form a tongue-and-groove seal between the cover member and the base member other than at the location of the hinge member, wherein engagement of the protrusion of the cover member within the slot of the hinge member forms a first portion of the outer seal between the cover member and the base member and the tongue-and-groove seal forms a second portion of the outer seal between the cover member and the base member.

15. The method of claim 13 wherein the lid assembly further includes a lip to assist in rotating the cover member between the open and closed positions.

16. A power inlet protection lid assembly comprising:
a base member having an opening;
a cover member pivotably interconnected with the base member via a hinge member for movement between open and closed positions;
an outer peripheral seal interposed between the base member and the cover member when the cover member is in the closed position, wherein the outer peripheral seal is located outwardly of the base member opening; and
an inner peripheral seal interposed between the base member and the cover member when the cover member is in the closed position, wherein the inner peripheral seal comprises mating tapered edges at the opening in the base member and on the cover member;
wherein the outer peripheral seal comprises a first outer seal portion caused by engagement between the cover member and the base member when the cover member is in the closed position, wherein the first portion of the outer seal defines a pair of spaced-apart end portions between which the hinge member is located, and wherein the outer peripheral seal further comprises a second outer seal portion caused by engagement between the cover member and the hinge member when the cover member is in the closed position, wherein the second outer seal portion comprises a slot that extends across a width defined by the hinge member and a protrusion on the cover that moves along with the cover toward and away from the hinge member when the cover member is moved toward and away from the closed position, wherein the slot of the hinge member remains stationary when the cover member is moved toward and away from the closed position, and wherein the protrusion of the cover member is spaced apart from the slot of the hinge member when the cover member is in the open position and is engaged within the slot of the hinge member when the cover member is in the closed position.

* * * * *

UNITED STATES PATENT AND TRADEMARK OFFICE
CERTIFICATE OF CORRECTION

PATENT NO. : 9,276,346 B1
APPLICATION NO. : 13/834404
DATED : March 1, 2016
INVENTOR(S) : Neil A. Czarnecki Page 1 of 1

It is certified that error appears in the above-identified patent and that said Letters Patent is hereby corrected as shown below:

IN THE CLAIMS

Claim 10, column 7, line 26, delete "scaling" and substitute therefor -- sealing --.

Signed and Sealed this
Second Day of August, 2016

Michelle K. Lee
*Director of the United States Patent and Trademark Office*